United States Patent
Ludwig et al.

(10) Patent No.: US 11,535,351 B2
(45) Date of Patent: Dec. 27, 2022

(54) DEMAGNETIZATION AND SIGNATURE MEASUREMENT SYSTEM

(71) Applicant: STL SYSTEMS AG, Tägerwilen (CH)

(72) Inventors: Wolfgang Ludwig, Tägerwilen (CH); Stefan Ludwig, Frauenfeld (CH); Christoph Ludwig, Constance (DE); Sezgin Kama, Itzehoe (DE); Adrianus J. Steinfort, Kreuzlingen (CH)

(73) Assignee: STL SYSTEMS AG, Tägerwilen (CH)

( * ) Notice: Subject to any disclaimer, the term of this patent is extended or adjusted under 35 U.S.C. 154(b) by 8 days.

(21) Appl. No.: 17/299,817

(22) PCT Filed: Nov. 28, 2019

(86) PCT No.: PCT/EP2019/082836
§ 371 (c)(1),
(2) Date: Jun. 4, 2021

(87) PCT Pub. No.: WO2020/120145
PCT Pub. Date: Jun. 18, 2020

(65) Prior Publication Data
US 2022/0017188 A1   Jan. 20, 2022

(30) Foreign Application Priority Data
Dec. 10, 2018 (DE) ...................... 10 2018 131 564.3

(51) Int. Cl.
*G01R 33/12* (2006.01)
*B63B 79/10* (2020.01)
(Continued)

(52) U.S. Cl.
CPC ............... *B63B 79/10* (2020.01); *B63G 9/06* (2013.01); *G01R 33/1215* (2013.01); *H01F 13/006* (2013.01)

(58) Field of Classification Search
None
See application file for complete search history.

(56) References Cited

U.S. PATENT DOCUMENTS

| | | | |
|---|---|---|---|
| 4,456,875 A | * | 6/1984 | Chenier ................ G01R 31/00 324/726 |
| 4,734,816 A | | 3/1988 | Guillemin et al. |

(Continued)

FOREIGN PATENT DOCUMENTS

| | | |
|---|---|---|
| EP | 0356146 A2 | 2/1990 |
| FR | 2620419 A1 | 3/1989 |

(Continued)

OTHER PUBLICATIONS

International search report for patent application No. PCT/EP2019/082836 dated Feb. 13, 2020.

*Primary Examiner* — Jermele M Hollington
*Assistant Examiner* — Taqi R Nasir
(74) *Attorney, Agent, or Firm* — Bachman & LaPointe, P.C.

(57) ABSTRACT

A device (2) for demagnetizing and for measuring the magnetic signature of a stationary hull (4) and for simulating a magnetic field, including a demagnetization coil assembly (8), a magnetic field sensor assembly (10) and a simulation coil assembly (12a, 12b, 12c), which can be positioned next to the hull (4) in a horizontal manner on one side and the cross-sectional areas of the demagnetization coils (8) and of the simulation coils (12a, 12b, 12c) being disposed in the longitudinal direction of the hull (4) with horizontally oriented surface normals. The demagnetization coils (8) produce an alternating magnetic field; the simulation coils (12a, 12b, 12c) produce a stationary simulated magnetic field in all three dimensions.

13 Claims, 5 Drawing Sheets

(51) Int. Cl.
 *B63G 9/06* (2006.01)
 *H01F 13/00* (2006.01)

(56) References Cited

U.S. PATENT DOCUMENTS

| | | | | |
|---|---|---|---|---|
| 2002/0109507 A1* | 8/2002 | Khalin | ............ | G01R 31/62 |
| | | | | 324/547 |
| 2007/0115603 A1* | 5/2007 | Maurer | ............ | H01F 13/006 |
| | | | | 361/149 |

FOREIGN PATENT DOCUMENTS

| | | | |
|---|---|---|---|
| FR | 2698698 | A1 | 6/1994 |
| JP | 2016005931 | A | 1/2016 |
| KR | 101614039 | B1 | 4/2016 |
| WO | 2013038377 | A1 | 3/2013 |

* cited by examiner

DEMAGNETIZATION AND SIGNATURE MEASUREMENT SYSTEM

BACKGROUND OF THE INVENTION

The invention relates to a device for demagnetizing and for measuring the magnetic signature of a stationary hull and for simulating a magnetic field, comprising a demagnetization coil assembly, a magnetic field sensor assembly and a simulation coil assembly.

Demagnetization devices for ships are known, in particular for military use, said demagnetization devices reducing the magnetization of the hull in order to make said ships harder to find for magnetic mines having a magnetic detonator, for example. In addition to the function of demagnetization, such devices are equipped for signature measurement—an Earth's magnetic field different from the natural ambient field can be simulated in order to attain the desired demagnetization state of the ship. Furthermore, said devices normally have the function of signature measurement, by means of which the magnetic signature of the ship can be recorded and analyzed. With respect to ships, said signature provides a measure for the detectability of the hull by means of a magnetic field sensor as used in the abovementioned magnetic mines, for example, or said signature is used for the adjustment of the demagnetization device of the ship.

From the state of the art, demagnetization devices are known where the ship moves across one or several demagnetization coil(s) which produce(s) a strong magnetic field mainly in the vertical direction. The demagnetization coils are fixed at a depth of approx. 8 m to 12 m in a horizontal position in a support structure which is anchored in the ground, their surface normals thus being oriented in a vertical manner in relation to the center of the earth. By slowly crossing the device, the alternating field which is produced by the coils and which has a constant amplitude is transformed into an alternating magnetic field which has an increasing and decreasing amplitude, thereby causing the demagnetization.

In order to simulate a magnetic field, a set of simulation coils is embedded in the same manner in a structure which is anchored in the ground, said simulation coils also producing a stationary magnetic field which is oriented mainly vertically and which has the desired field strength. During the demagnetization process, the simulation coil system and the demagnetization coil system are normally operated at the same time.

The signature measurement is often realized by means of magnetic field sensor lines, the ship's movement across the sensor lines resulting in two-dimensional magnetic field maps which reflect the magnetization of the ship.

Such devices, across which a ship can move, are comparatively inexpensive, but said devices are characterized by operational disadvantages. In addition to the restriction with respect to the location due to the orientation of the device in relation to the Earth's magnetic field, the large amount of time needed for the signature measurement process—because the ship has to move across the device repeatedly in different directions—and the fact that only transverse fields and vertical fields in relation to the longitudinal direction of the hull can be produced for the simulation are particularly disadvantageous. This is expressed, for example, in the fact that, due to the natural migration of the Earth's magnetic field vector, the device is no longer aligned with the Earth's magnetic field as it was upon setup, which is why the quality of the demagnetization and signature measurement results deteriorates. Another serious disadvantage is that the demagnetization field depends on the tidal range because the distance between the ship and the demagnetization coil changes depending on the water level. If there is a tidal range of more than 2 m, considerable restrictions for the use of the device can occur.

From WO 2013/038377, for example, cage-shaped devices are known in which the ship is located in a stationary manner within the interior of a cage which is composed of coils. In most cases, said devices are realized in the form of a cuboid and can accommodate the ship as a whole. The orientation of said devices in relation to the Earth's magnetic field is arbitrary because homogenous magnetic fields in all three dimensions can be produced within the interior of the cage in order to simulate the magnetic field. The demagnetization fields are produced in the longitudinal direction of the hull and are therefore particularly effective.

Concerning said type of device, high costs resulting from the size of the device are disadvantageous; in particular, ships having high superstructures require very large devices. Furthermore, high demagnetization power is required due to the large demagnetization volume, and since the hull is arranged in the longitudinal direction of the interior of the coils, only longitudinal fields are produced for the demagnetization.

SUMMARY OF THE INVENTION

Therefore, the object of the present intervention is to indicate a demagnetization device offering a high level of demagnetization efficiency at lower production and operating costs compared to existing devices.

In connection with one aspect of the disclosure, said object is attained by the fact that—in relation to a ship entering the device—the device can be positioned horizontally next to the hull on one side in the longitudinal direction of the hull, the demagnetization coil assembly having at least two demagnetization coils, the cross-sectional areas of said demagnetization coils being disposed next to one another in the longitudinal direction of the hull and the surface normals of said demagnetization coils being oriented in a horizontal manner, an alternating magnetic field progressing in the longitudinal direction of the hull thus being produced outside the demagnetization coils. Instead of at least two demagnetization coils in which an alternating magnetic field is produced, it is also possible to use a single demagnetization coil, the length of said demagnetization coil extending across the entire length of the ship, and, as a result, an alternating field is no longer produced.

According to the invention, the demagnetization coils are disposed at a jetty or a quay wall, for example, in such a manner that their surface normals are oriented in a horizontal manner. Therefore, the hull is not demagnetized from below, but by means of magnetic field lines entering on a longitudinal side of the ship. The demagnetization coils are disposed along a longitudinal side of the ship, an alternating magnetic field progressing in the longitudinal direction of the hull thus being producible. The passage of the ship along the demagnetization coil assembly is not required and is replaced by an alternating magnetic field if two or more demagnetization coils are provided, said alternating magnetic field passing the stationary hull.

In addition to the advantage of the moored (stationary) ship, the advantage is that, due to the compact demagnetization coil assembly, short demagnetization times occur in conjunction with comparatively low costs. In a simple manner, the demagnetization coil assembly can be fixed to or integrated into a jetty or a quay wall.

In a further embodiment, the progressing alternating magnetic field has a horizontal transverse component and/or a longitudinal component in relation to the longitudinal direction of the hull. In the latter case, at least three demagnetization coils are required for the progression.

In addition to the longitudinal component of the alternating field, which is particularly effective for the demagnetization process, the device according to the invention can be used for producing a horizontal transverse component of the alternating field. The horizontal transverse component of the alternating field and the longitudinal component of the alternating field cause a high demagnetization efficiency.

In an advantageous embodiment, the simulation coil assembly has simulation coils, the cross-sectional areas of said simulation coils being disposed next to one another in the longitudinal direction of the hull and their surface normals being oriented in a horizontal manner, a stationary simulated magnetic field which comprises a vertical component, a transverse component and a longitudinal component in relation to the longitudinal direction of the hull thus being producible outside the simulation coils.

The simulation coil assembly comprises simulation coils which are oriented in the same manner as the demagnetization coils. As a result, desired stationary magnetic field structures having magnetic field components in all three dimensions can be simulated in a very flexible manner and the Earth's magnetic field, for example, can be compensated regardless of the geometric orientation of the device. In a preferred embodiment, the simulation coil assembly has at least five simulation coils, at least two counteracting simulation coils being used for producing the vertical component, at least one simulation coil being used for producing the transverse component and at least two counteracting simulation coils being used for producing the longitudinal component of the simulated magnetic field.

Two counter-operated simulation coils disposed next to one another in the longitudinal direction of the hull produce a longitudinal component of the simulated magnetic field; two simulation coils disposed above one another in the vertical direction produce the vertical component of the simulated magnetic field. In order to produce the transverse component of the simulated magnetic field, only one simulation coil is required.

For measuring the magnetic signature, the magnetic field sensor assembly has magnetic field sensors which are disposed, for example, in a plane of the respective cross-sectional areas of the demagnetization coils and/or simulation coils.

The magnetic field sensors are preferably disposed in a plane of the respective cross-sectional areas of the demagnetization coils and/or of the simulation coils in order to analyze the existing magnetic field of the ship at the place where the corresponding coils are located.

In a preferred embodiment, the device according to the invention is fixed to or integrated into a non-magnetic jetty and/or a quay wall.

For a more effective demagnetization and for a more precise simulation of the magnetic field, two devices according to the invention can be positioned in a horizontal manner on opposite sides in the longitudinal direction of the hull.

In said embodiment, one device according to the invention per jetty or quay wall can be disposed at a jetty or a quay wall, the hull being located in a stationary manner between two jetties or between the jetty and the quay wall having the devices according to the invention.

In order to demagnetize ships in an immersed position, the device can be mounted to a jetty which is adjustable in height or can be mounted in a height-adjustable manner to a fixed jetty or a quay wall in such a manner that the coils are completely submerged in water.

The demagnetization system can also be integrated into a floating dock or a dry dock which is realized in a non-magnetic manner and which comprises the entire electric/electronic device such as current generators, current source generators and signal processing systems. For large ship widths, it is advantageous if a third assembly of demagnetization coils is integrated at the bottom of the dock in order to increase the demagnetization field strength.

BRIEF DESCRIPTION OF THE DRAWINGS

Further advantageous features can be derived from the following description and from the drawings, which describe preferred embodiments of the invention using examples.

In the following.

DETAILED DESCRIPTION

Figure 1:
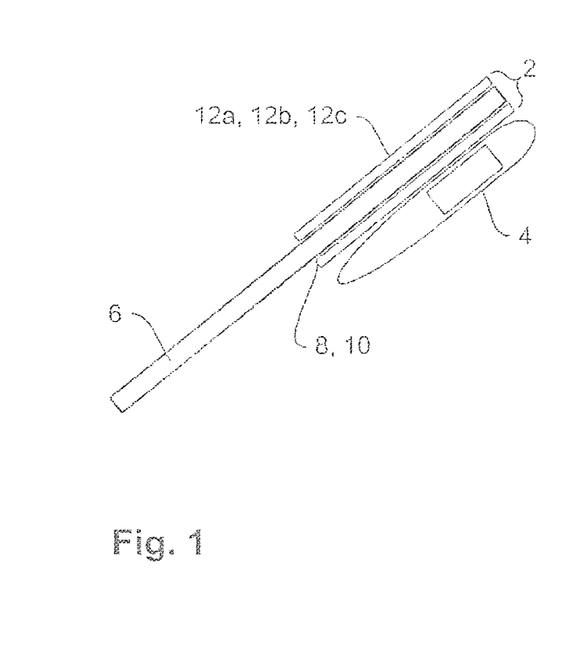
FIG. 1 is a schematic illustration of the device according to the invention in plan view.

In FIG. 1, a schematic view of how device 2 according to the invention can be positioned in relation to a stationary hull 4 is shown. By berthing and mooring hull 4 at a non-magnetic jetty 6, device 2 according to the invention can be positioned in such a manner that said device is located next to hull 4 in a horizontal manner on one side. Therefore, hull 4 remains stationary instead of being moved past device 2 during the demagnetization process and during the magnetic signature measurement and for simulating the magnetic field. Device 2 according to the invention, which is composed of demagnetization coil assembly 8 having magnetic field sensors 10 and of simulation coil assembly 12a, 12b, 12c, is fixed to or integrated into jetty 6. Demagnetization coil assembly 8, which has magnetic field sensors 10, and simulation coil assembly 12a, 12b, 12c can be fixed to or integrated into the jetty in any manner, but they are always disposed in such a manner that their cross-sectional areas and their surface normals are oriented in a horizontal manner (in the drawing layer).

Figure 2:
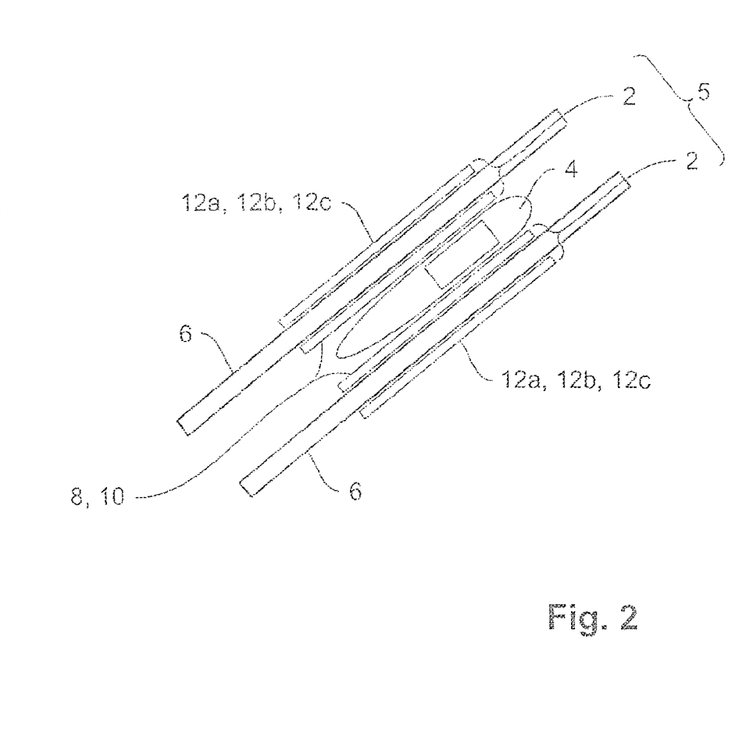
FIG. 2 is a schematic illustration of the first enhanced device according to the invention in plan view.

FIG. 2 shows a schematic view of first enhanced device 5 according to the invention which is composed of two devices 2 according to the invention which can be positioned next to hull 4 on opposite sides in a horizontal manner on one side.

In said first enhanced embodiment 5, hull 4 is located between two jetties 6 comprising respective devices 2.

Figure 3:
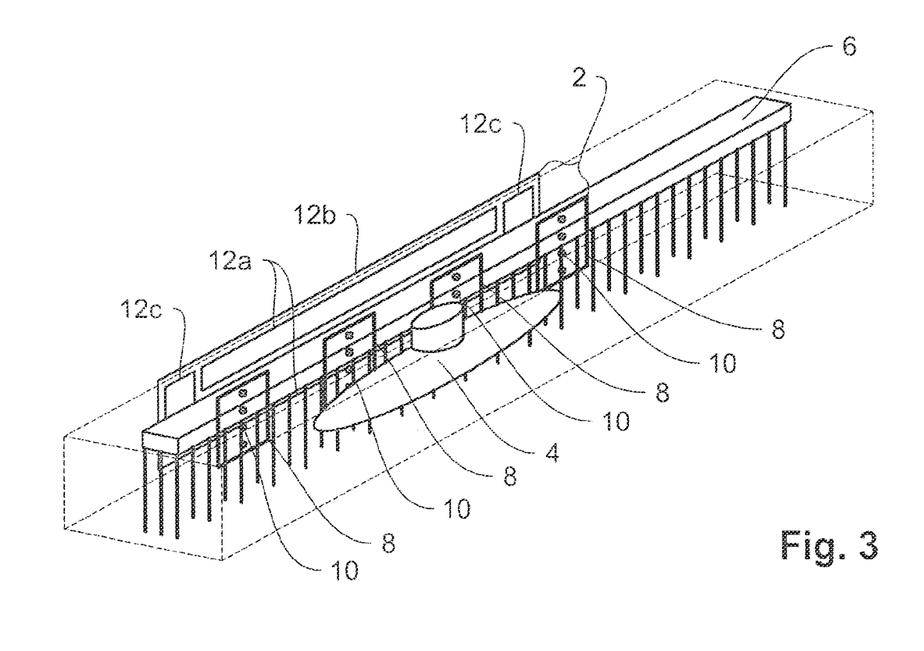
FIG. 3 is a schematic illustration of the device according to the invention according to FIG. 1 in a three-dimensional view.

FIG. 3 shows a schematic view of device 2 according to the invention from FIG. 1 in three-dimensional view. Four demagnetization coils 8 having four magnetic field sensors 10 disposed in respective coil planes of demagnetization coils 8 are located next to one another in a plane in the longitudinal direction of hull 4. A total of five simulation coils 12a, 12b, 12c are disposed in a plane on the opposite side of jetty 6.

Figure 4:
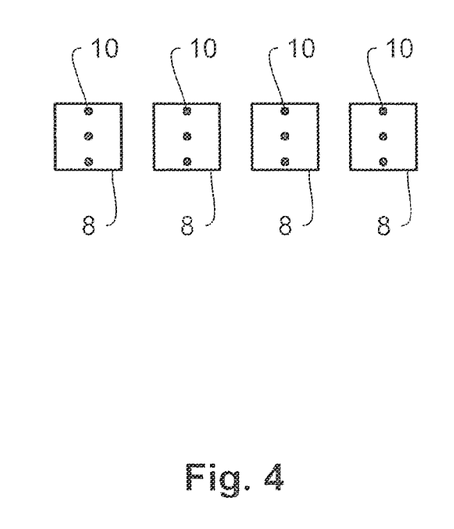
FIG. 4 is a schematic illustration of the demagnetization coil assembly having magnetic field sensors in lateral view.

FIG. 4 shows a schematic view of the plane of the demagnetization coil assembly having four demagnetization coils 8, each having three magnetic field sensors 10 in the present case. In order to produce the progressing alternating magnetic field, at least two demagnetization coils 8 are required. Each demagnetization coil 8 comprises at least two magnetic field sensors 10 for measuring the signature.

Figure 5:
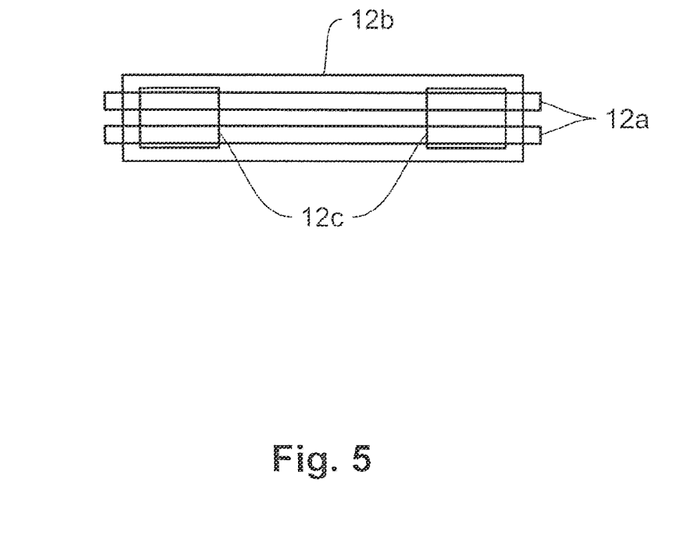
FIG. 5 is a schematic illustration of the simulation coil assembly in lateral view.

FIG. 5 shows a schematic view of the simulation coil assembly which is composed of at least five simulation coils 12a, 12b, 12c.

Figure 6A:
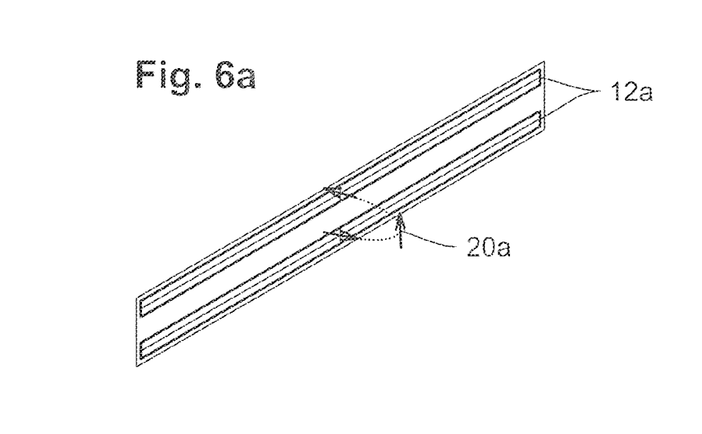
FIG. 6a, FIG. 6b, FIG. 6c show a production of the magnetic field components of the simulated magnetic field
Figure 6B:
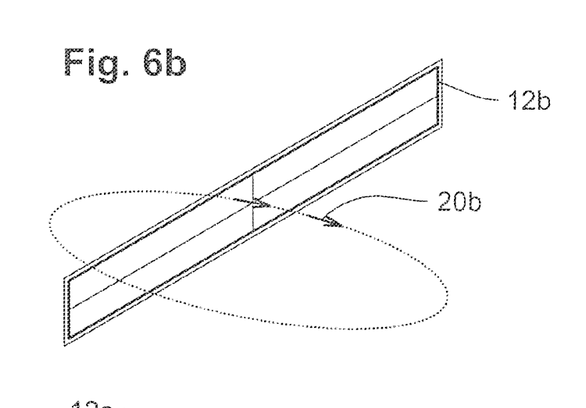
Figure 6C:
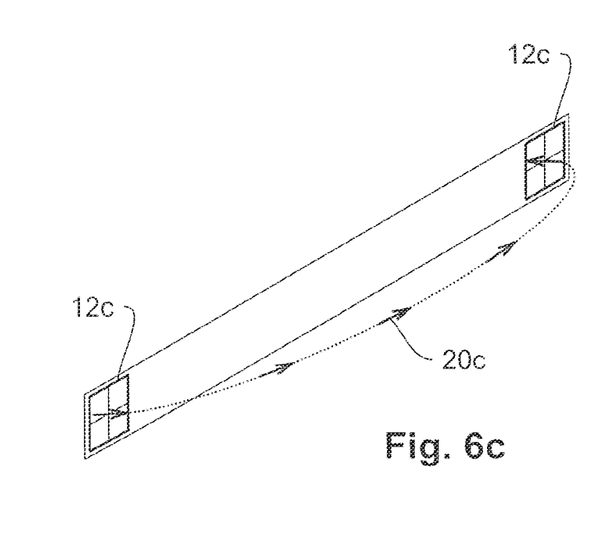

In FIGS. 6a, 6b, and 6c, the impact of said coils on the production of a stationary simulated magnetic field is shown.

FIG. 6a shows simulation coils 12a which are disposed next to one another in a vertical manner in order to produce a vertical component 20a of the simulated magnetic field.

FIG. 6b shows transverse component 20b of the stationary simulated magnetic field which is produced by a simulation coil 12b.

In FIG. 6c, the pair of coils which is composed of simulation coils 12c is shown, said pair of coils producing a longitudinal component 20c of the stationary simulated magnetic field.

Figure 7:
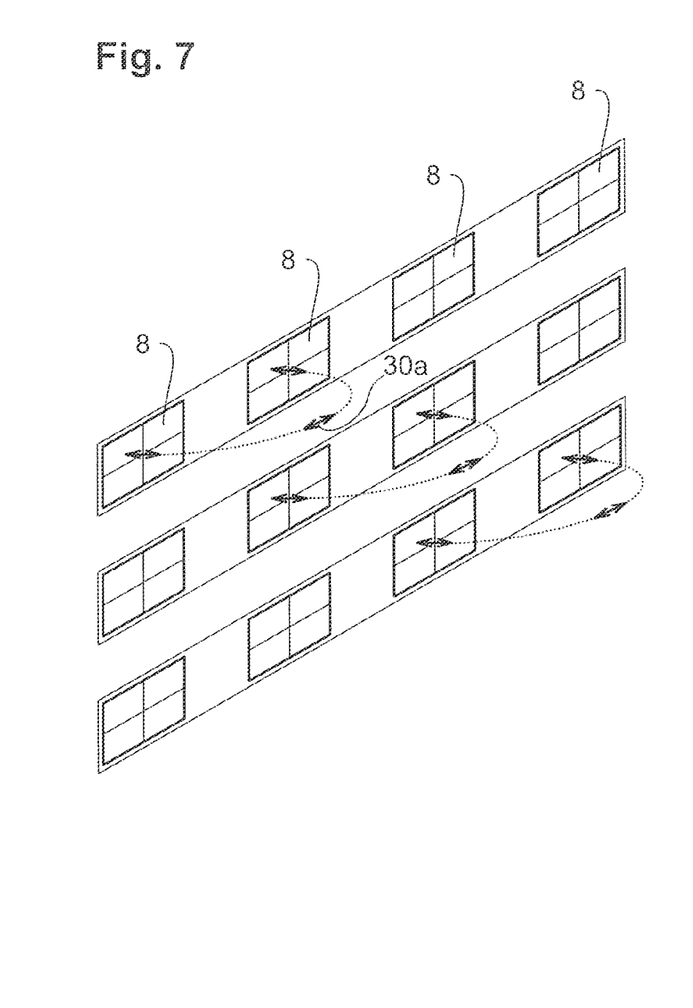
FIG. 7 shows a production of the longitudinal component of the progressing alternating magnetic field and FIG. 8 shows a production of the horizontal transverse component of the progressing alternating magnetic field.

In FIG. 7, the production of a progressing demagnetizing alternating field (longitudinal component 30a of the alternating field) is shown, said demagnetizing alternating field being oriented in the longitudinal direction and being produced outside the coil plane by two counteracting demagnetization coils 8 which are adjacent to one another.

The maximum of the field amplitude of longitudinal component 30a of the alternating field is located in the left area of the coil in the upper line, in the central area of the coil in the central line and in the right area of the coil in the lower line. By means of a corresponding current control and the resulting excitation of respective demagnetization coils 8, the maximum of longitudinal component 30a of the alternating field migrates in the longitudinal direction of the demagnetization coil assembly and therefore passes hull 4 in the longitudinal direction.

Figure 8:
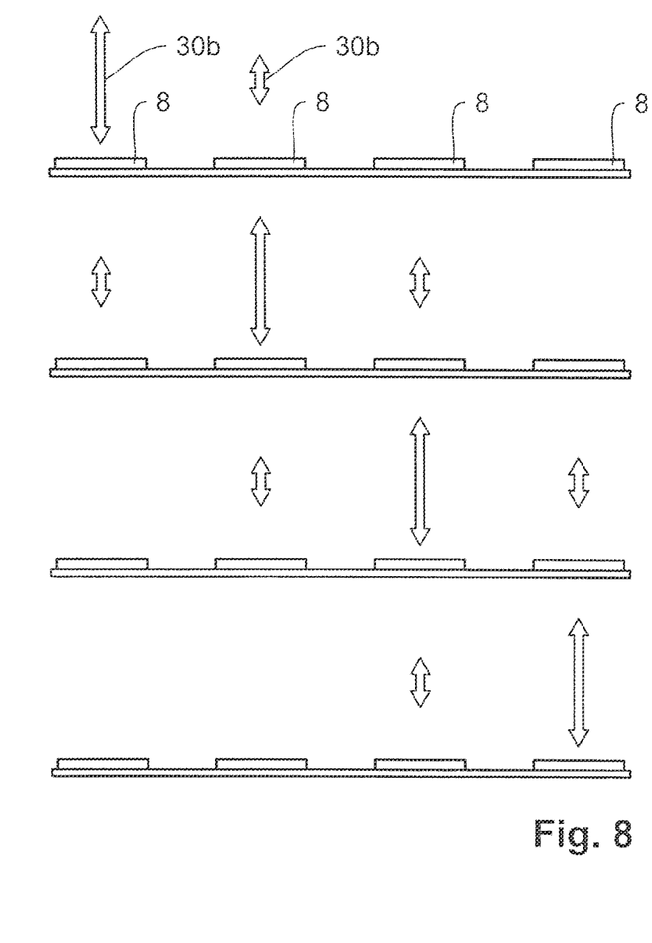

FIG. 8 shows the production of a progressing demagnetizing alternating field (horizontal transverse component 30b of the alternating field) outside the coil plane by means of several identically operated demagnetization coils disposed adjacent to one another.

In the upper line, the maximum of the field amplitude of horizontal transverse component 30b of the alternating field is located in the left area of the coil. As shown in the subjacent lines, the maximum of horizontal transverse component 30b of the alternating field migrates to the right in the longitudinal direction at the demagnetization coil assembly and therefore passes hull 4 in the longitudinal direction by means of a corresponding current control and the resulting excitation of respective demagnetization coils 8.

REFERENCE SIGNS 2 device
4 hull
5 enhanced device
6 jetty
8 demagnetization coil assembly
10 magnetic field sensors
12a/b/c simulation coils
20a vertical component
20b transverse component
20c longitudinal component
30a longitudinal component of the alternating field
30b transverse component of the alternating field

The invention claimed is:

1. A device (2) for demagnetizing and for measuring the magnetic signature of a stationary hull (4) and for simulating a magnetic field (20a, 20b, 20c), comprising a demagnetization coil assembly (8), a magnetic field sensor assembly (10) and a simulation coil assembly (12a, 12b, 12c),
wherein
the device (2) can be positioned horizontally next to the hull (4) on one side in the longitudinal direction of the hull (4),
the demagnetization coil assembly (8) having a single demagnetization coil (8), the cross-sectional area of said demagnetization coil extending at least across the entire length of the hull (4) and the surface normal of said demagnetization coil being oriented orthogonally to the longitudinal direction of the hull (4), a stationary alternating magnetic field thus being producible outside the demagnetization coil (8), or the demagnetization coil assembly having at least two demagnetization coils (8), the cross-sectional areas of said demagnetization coils being disposed next to one another in the longitudinal direction of the hull (4) and the surface normals of said demagnetization coils being oriented orthogonally to the longitudinal direction of the hull (4), an alternating magnetic field (30a, 30b) progressing in the longitudinal direction of the hull (4) thus being producible outside the demagnetization coils (8).

2. The device according to claim 1, wherein the progressing alternating magnetic field (30a, 30b) has a horizontal transverse component (30b) and a longitudinal component (30a) in relation to the longitudinal direction of the hull (4).

3. The device according to claim 1, wherein the cross-sectional areas of the simulation coils (12a, 12b, 12c) are disposed next to one another in the longitudinal direction of the hull (4) and wherein their surface normals are oriented in a horizontal manner, a stationary simulated magnetic field (20a, 20b, 20c) which comprises a vertical component (20a), a transverse component (20b) and a longitudinal component (20c) in relation to the longitudinal direction of the hull (4) thus being producible outside the simulation coils (12a, 12b, 12c).

4. The device according to claim 3, wherein the simulation coil assembly (12a, 12b, 12c) has at least five simulation coils (12a, 12b, 12c), at least two opposite simulation coils (12a) being used for producing the vertical component (20a), at least one simulation coil (12b) being used for producing the transverse component (20b) and at least two counteracting simulation coils (12c) being used for producing the longitudinal component (20c) of the simulated magnetic field (20a, 20b, 20c).

5. The device according to claim 1, wherein the magnetic field sensor assembly (10) has magnetic field sensors (10) which are disposed in a plane of the respective cross-sectional areas of the demagnetization coils (8) and/or simulation coils.

6. A use of the device (2) according to claim 1, wherein the device is fixed to a non-magnetic jetty (6) or to a quay wall.

7. The use of the device (2) according to claim 6, wherein the device is fixed in a height-adjustable manner.

8. A first enhanced device (5) for demagnetizing and for measuring the magnetic signature of a stationary hull (4) and for simulating a magnetic field (20a, 20b, 20c), comprising two devices (2) according to claim 1 which can be positioned in a horizontal manner on opposite sides of the hull (4) in its longitudinal direction.

9. A use of the first enhanced device according to claim 8, wherein the first enhanced device is fixed in a non-magnetic floating dock or dry dock.

10. A second enhanced device for demagnetizing and for measuring the magnetic signature of a stationary hull (4) and for simulating a magnetic field (20a, 20b, 20c), comprising three devices (2) according to claim 1 which can be positioned in a horizontal manner on opposite sides of the hull (4) and below the hull (4) in its longitudinal direction.

11. A use of the second enhanced device according to claim 10, wherein the second enhanced device is fixed in a non-magnetic floating dock or dry dock.

12. A third enhanced device for demagnetizing and for measuring the magnetic signature of a stationary hull (4) and for simulating a magnetic field (20a, 20b, 20c),
comprising
one device according to claim 1 or two devices (2) according to claim 1 which can be positioned in a horizontal manner on opposite sides in the longitudinal direction of the hull (4), and an additional demagnetization coil assembly which can be positioned below the hull (4) and which has a single demagnetization coil (8), the cross-sectional area of said demagnetization coil extending at least across the entire length of the hull (4) and the surface normal of said demagnetization coil being oriented orthogonally to the longitudinal direction of the hull (4), a stationary alternating magnetic field thus being producible outside the demagnetization coil (8), or which has at least two demagnetization coils (8), the cross-sectional areas of said demagnetization coils being disposed next to one another in the longitudinal direction of the hull (4) and the surface normals of said demagnetization coils being oriented in a horizontal manner orthogonally to the longitudinal direction of the hull (4), an alternating magnetic field (30a, 30b) progressing in the longitudinal direction of the hull (4) thus being producible outside the demagnetization coils (8).

13. A use of the third enhanced device according to claim 12, wherein the third enhanced device is fixed in a non-magnetic floating dock or dry dock.

* * * * *